(12) United States Patent
Tonami et al.

(10) Patent No.: US 6,859,232 B1
(45) Date of Patent: Feb. 22, 2005

(54) TWO-DIMENSIONAL ARRAY TYPE RADIATION DETECTOR

(75) Inventors: Hiromichi Tonami, Kyoto-fu (JP); Junichi Ohi, Muko (JP)

(73) Assignee: Shimadzu Corporation, Kyto (JP)

( * ) Notice: Subject to any disclaimer, the term of this patent is extended or adjusted under 35 U.S.C. 154(b) by 902 days.

(21) Appl. No.: 09/657,223

(22) Filed: Sep. 7, 2000

(30) Foreign Application Priority Data

Jan. 7, 2000 (JP) ........................................ 2000-005951

(51) Int. Cl.⁷ .............................. H04N 3/14; G01T 1/24
(52) U.S. Cl. .................................. 348/302; 250/370.09
(58) Field of Search ....................... 250/370.09, 370.08, 250/370.11, 370.14; 348/302, 303, 304, 308, 274

(56) References Cited

U.S. PATENT DOCUMENTS

| | | | | |
|---|---|---|---|---|
| 4,942,474 A | * | 7/1990 | Akimoto et al. | 348/301 |
| 5,262,871 A | * | 11/1993 | Wilder et al. | 348/307 |
| 5,909,029 A | * | 6/1999 | Tonami et al. | 250/367 |
| 6,630,676 B2 | * | 10/2003 | Takemoto | 250/370.09 |

FOREIGN PATENT DOCUMENTS

JP          6-342078          12/1994

* cited by examiner

Primary Examiner—Wendy R. Garber
Assistant Examiner—Rashawn N Tillery
(74) Attorney, Agent, or Firm—Manabu Kanesaka

(57) ABSTRACT

In the two-dimensional array type radiation detector, one of gate bus lines, which send scanning pulses from a gate driver section controlled by a control section to gates of FETs, and one of data bus lines, which transfer signals in photoelectric conversion elements to a data collecting section, are arranged parallel to each other to be disposed in one row of insensitive sections, respectively. The gate bus lines and data bus lines are taken out from one side of the detector panel, and the control section, the gate driver section and the data collecting section are disposed at the same side of the detector panel. By connecting a plurality of modules each being structured as stated above, a two-dimensional array type radiation detector having a large detecting surface, which is required for a cone beam X-ray CT apparatus, can be formed.

3 Claims, 5 Drawing Sheets

14a Module 128 ch

64ch x 10 Module = 640ch

14a Module

TWO-DIMENSIONAL ARRAY TYPE RADIATION DETECTOR

BACKGROUND OF THE INVENTION AND RELATED ART STATEMENT

The present invention relates to a panel type X-ray solid detector, and especially, the invention relates to a two-dimensional array type radiation detector used for a multi-slice X-ray CT apparatus or a cone beam X-ray CT apparatus.

In an X-ray CT apparatus, X-ray is irradiated from an X-ray tube, and concentrated into a fan-shaped X-ray beam by a collimator at a radiation port, and the X-ray tube, the collimator in an arc shape disposed to face the X-ray tube and the detector are rotated around a subject to be detected. Then, the detector captures information of X-ray which has passed through the subject so that signals thereof are processed by a computer to obtain the X-ray tomograph image of the detected subject.

The detector has a structure such that approximately 500 to 1000 channels of X-ray detecting elements, each of which is formed of a scintillator element for converting X-ray into light and a photodiode for detecting the light converted by the scintillator element to output as the electric signal, are arranged in an arc shape around the X-ray tube.

From the viewpoint of the mechanical arrangement upon manufacturing, 8 to 30 pieces of a combination of the scintillator and photodiode adhered optically are arranged on the base plate to constitute one module, and the above detector modules are arranged continuously on a circumference in an approximately arc shape and combined with the collimator to form the solid detector for CT.

The conventional radiation detector is structured as described above. Since only one slice of the tomograph image is obtained in the detector arranged one-dimensionally in a channel direction (a direction perpendicular to a body axis of the detected subject), it is required to scan many times in order to obtain the multi-layered tomograph images. In order to obtain the many slice data at once, there has been considered a two-dimensional array type radiation detector in which X-ray detecting elements are arranged not only in the channel direction but also in a slice direction (a body axis direction of the detected subject) perpendicular to the channel direction, and a detector, which is used together with a cone beam X-ray tube to collect multi-slice data with a minute slice pitch in a short time, has been expected.

This two-dimensional array type radiation detector is formed of an X-ray converting film which normally converts X-ray into light; photodiode arrays arranged in a matrix form right under the x-ray converting film; and switching elements connected to the respective photodiode arrays. There are two types of the two-dimensional array type radiation detector. Namely, a first type is a detector in which the switching elements are sequentially turned on after irradiation of the X-ray, so that signal charges stored in the respective pixels are read out to form the X-ray image. A second type is a detector which has a radiation sensor array formed of a converting film directly outputting a charge signal corresponding to an incident amount by responding to the radiation, and switching elements connected to electrodes arranged in a matrix form arranged right under the radiation sensor array, wherein the respective switching elements are sequentially turned on at the time of irradiation, so that the signal charges stored in the respective pixels are read out to form the X-ray image. Here, the first type will be explained.

FIG. 4 shows a detection circuit of the first type of the two-dimensional array type radiation detector. In the detector, scintillators 11 for converting X-ray into light are formed uniformly on a front surface of the detector, and on a rear surface of each scintillator, photoelectric conversion elements 1, such as photodiodes, which convert light into electric signal, are arranged in an array in order vertically and horizontally. Then, switching elements, such as FETs 2, are formed to form pairs with the photoelectric conversion elements 1, and terminals of sources 5 of the respective FETs 2 are connected to the photoelectric conversion elements 1. Terminals of gates 3 of the respective FETs 2 are connected to gate bus lines in a horizontal direction, and terminals of drains 4 of the respective FETs 2 are connected to data bus lines 7 in a vertical direction. A gate driver section 8 and a data collecting section 9 are controlled by a control section 10, and pulse signals from the gate driver section 8 are outputted to the gates 3 of the FETs 2, sequentially from the upper side to the lower side through the gate bus lines 6 formed in the horizontal direction. Picture charge signals stored in the photoelectric conversion elements 1 are read out from the sources 5 to the drains 4, and taken into the data collecting section 9 from the data bus lines 7 formed in the vertical direction. Then, the picture data signals which are taken are outputted to an outside from the data collecting section 9.

FIG. 5 shows a sectional structure of the two-dimensional array type radiation detector. In the detector, the scintillator 11, photoelectric conversion elements 1 (a-Si:H PDA or the like) and switching elements (a-Si:H FET 2 or the like) are formed on a base plate 13. The gate bus lines 6 are formed on the base plate 13, and the electrodes of the gates 3 of the FETs 2 are laminated on the gate bus lines 6. Then, the FETs 2 as the switching elements are formed orderly side by side. Also, the data bus lines 7 on an insulation 16 are laminated on the electrodes of the drains 4 of the FETs 2. And, the gate bus lines 6 situated in the lower layer and the data bus lines 7 situated in the upper layer are arranged perpendicular to each other with the insulation therebetween. Then, the photoelectric conversion elements 1 are formed orderly side by side on the electrodes of the sources 5 of the FETs 2. The scintillator 11 is formed on the entire upper surfaces of the photoelectric conversion elements.

The conventional two-dimensional array type radiation detector is structured as described above. In case the two-dimensional array type radiation detector is applied to the cone beam X-ray CT apparatus, a matrix size of the detector ranges from 512×512 to 2,048×2,048, and an outside size of the detector is of a square with one side of 200 mm to 300 mm, so that the size of the detector can not respond to the size required in the cone beam X-ray CT apparatus, for example, 1,000 mm×200 mm. Also, even if the four detectors respectively having a size of 300 mm×300 mm are connected to have the size of 1,200 mm×300 mm, the gate bus lines 6 are arranged perpendicular to the data bus lines 7 such that the gate driver section 8 for the horizontal scanning occupies one side and the data collecting section 9 for reading data occupies another side, or in some cases, the gate driver section 8 and the data collecting section 9 occupy all the four sides. Thus, even if the detectors are arranged side by side in a traverse direction, since the electronic components, such as scanning circuits, are mounted in connection portions thereof, a large dead space is formed. Thus, the above arrangement is not practical.

The present invention has been made in view of the foregoing, and an object of the invention is to provide a two-dimensional array type radiation detector, which has a large detecting surface with a two-dimensional array type required for the cone beam X-ray CT apparatus.

Further objects and advantages of the invention will be apparent from the following description of the invention.

SUMMARY OF THE INVENTION

To achieve the above object, the present invention provides a two-dimensional array type radiation detector, which is formed of a converting layer for responding to radiation to output a charge signal corresponding to an incident amount; switching elements arranged in a matrix form right under the converting layer and connected thereto; a gate driver section for turning on the respective switching elements through gate bus lines at the time of reading out the signal; a data collecting section for reading out charge signals stored in respective pixels through data bus lines; and a control section for controlling the gate driver section and the data collecting section. The gate bus lines and the data bus lines are arranged parallel to each other in the spaces or intervals of the rows of the pixels.

Also, in the two-dimensional array type radiation detector of the invention, one gate bus line and one data bus line are arranged in each space of the rows of the pixels.

Further, in the two-dimensional array type radiation detector of the invention, the two-dimensional array type radiation detector constitutes one module, and a plurality of modules is connected at end surfaces where the gate bus lines and data bus lines are not formed.

The two-dimensional array type radiation detector of the invention is structured as described above. In the detector panel, the gate bus lines and the data bus lines are arranged parallel to each other in insensitive sections located between the respective rows of the pixels; one gate bus line and one data bus line are situated in each space of the rows of the pixels; and a scanning circuit and signal take-out section occupy only one side out of four sides of the detector panel. Therefore, the entire detector is structured by arranging a plurality of detector panels manufactured per module, so that the large two-dimensional array type radiation detector for the cone beam X-ray CT apparatus or the like can be manufactured.

DETAILED DESCRIPTION OF PREFERRED EMBODIMENTS

Figure 1:
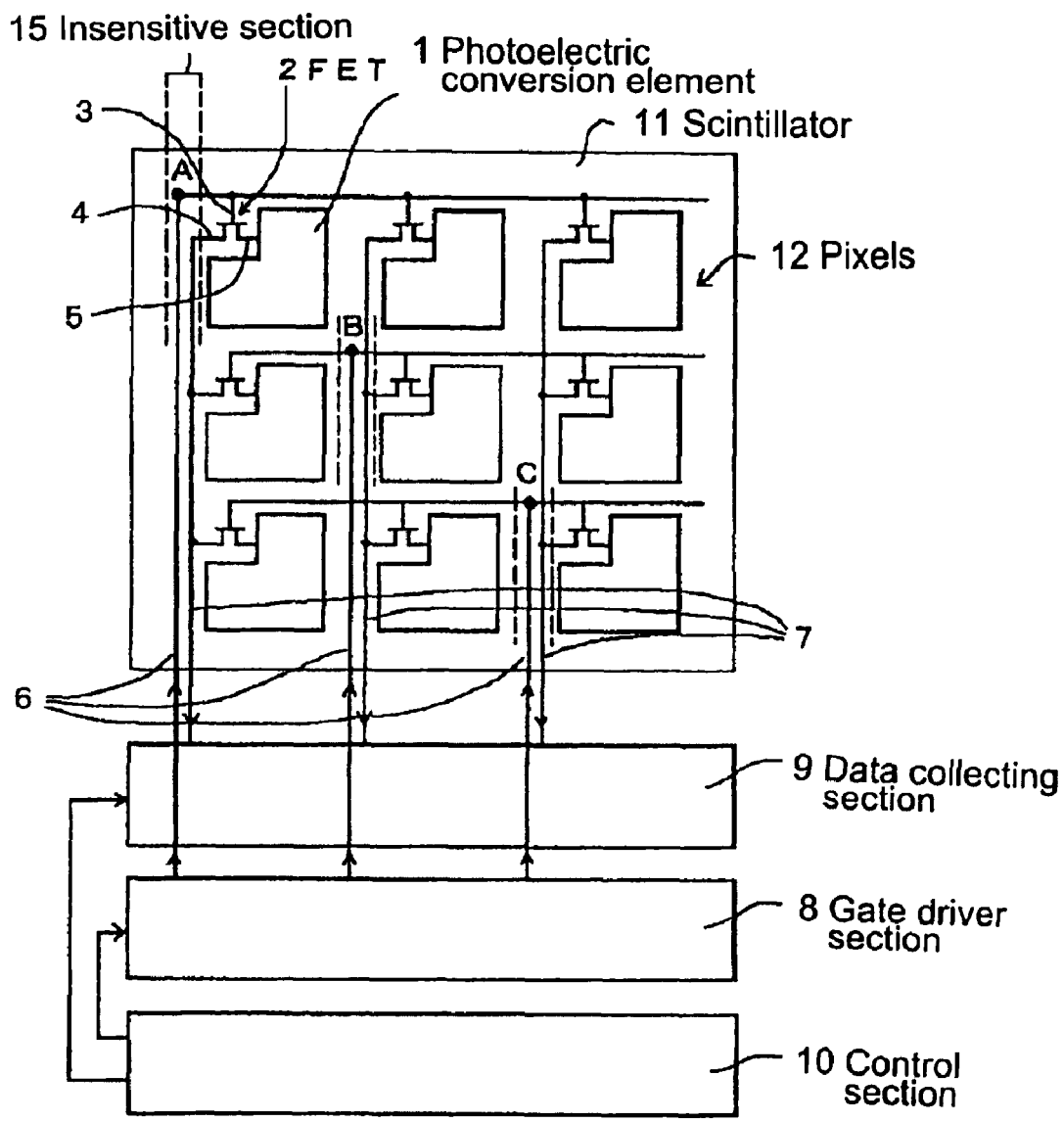
FIG. 1 is a diagram showing an embodiment of a two-dimensional array type radiation detector of the invention.

Hereunder, an embodiment of a two-dimensional array type radiation detector of the invention will be explained with reference to FIG. 1. FIG. 1 shows a detecting circuit of the two-dimensional array type radiation detector of the invention. Although the two-dimensional array type radiation detector is formed of the same components as in the conventional detector, the two-dimensional array type radiation detector of the invention is different in a wiring method of bus lines 6 in a scanning circuit and data bus lines 7 in a readout circuit on a detector panel; and the arrangements of a gate driver section 8 as an electronic circuit section, a data collecting section 9 and a control section 10.

In the detector of the embodiment, a scintillator 11 for converting X-ray into light is uniformly formed on a front surface of the detector, and on a rear side of the scintillator, photoelectric conversion elements 1, such as photodiodes, which convert light into electric signals, are arranged in an array in order vertically and horizontally. Then, switching elements, such as FETs 2, are formed to be paired with the photoelectric conversion elements 1, and terminals of sources 5 of the FETs 2 are respectively connected to the photoelectric conversion elements 1. Terminals of gates 3 of the FETs 2 are respectively connected to gate bus lines 6 in a vertical direction, and terminals of drains 4 of the FETs 2 are respectively connected to the data bus lines 7 in the vertical direction.

The gate driver section 8 and the data collecting section 9 are controlled by the control section 10. Namely, pulse signals from the gate driver section 8 are provided to the gates 3 of the FETs 2 by sequentially scanning at a point A, a point B, a point C and so on (which continues further) as shown in the figure from an upper side to a lower side through the gate bus lines 6, and picture charge signals stored in the photoelectric conversion elements 1 are read out from the sources 5 to the drains 4 and taken into the data collecting section 9 through the data bus lines 7 formed in the vertical direction. Then, the picture data signals which are taken are outputted to an outside from the data collecting section 9.

In this structure, the gate bus lines 6 and the data bus lines 7 are arranged parallel to each other, and the gate driver section 8 for horizontal scanning and the data collecting section 9 for reading occupy only one side of the detector panel. In this case, since the gate bus lines 6 are close to the data bus lines 7, noises are likely to be generated in the data bus lines 7. Thus, structurally, one gate bus line 6 and one data bus line 7 are arranged in one insensitive section row 15.

Figure 5:
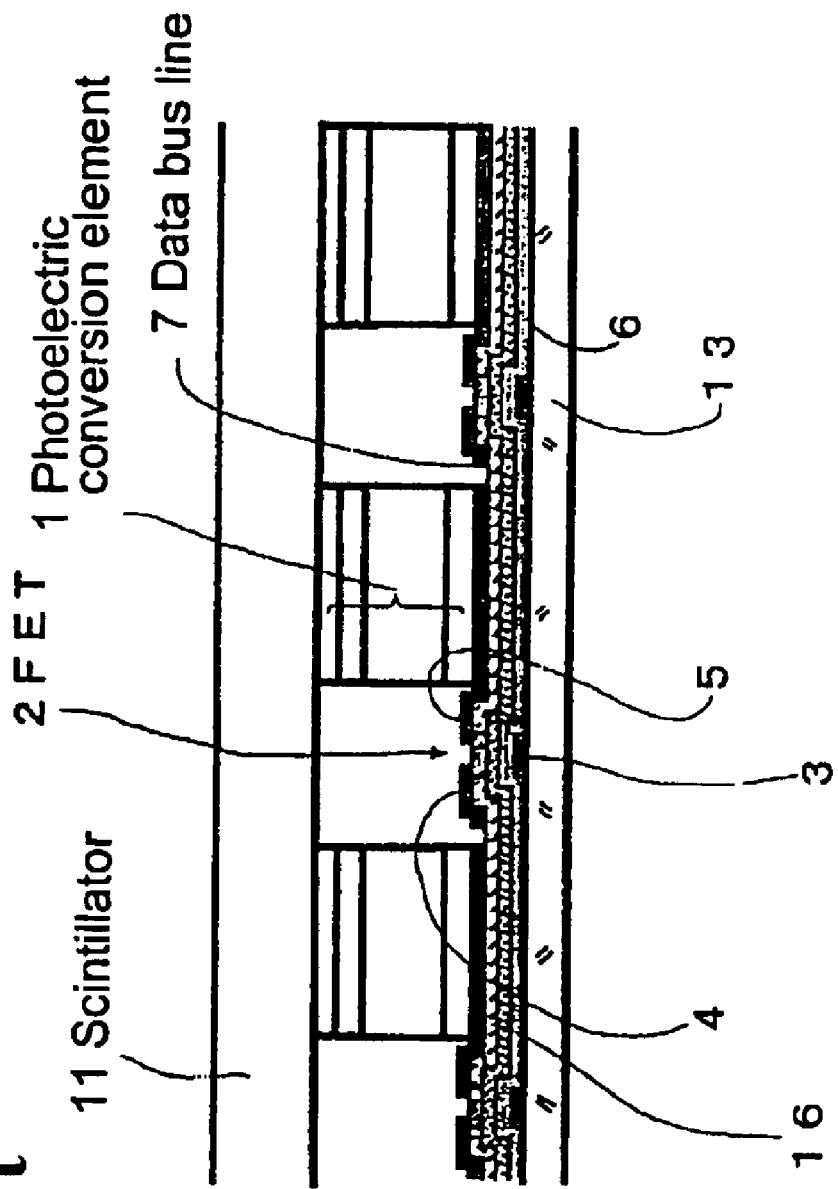
FIG. 5 is a sectional view showing a sectional structure of the conventional two-dimensional array type radiation detector.

Although there are portions where the gate bus lines 6 are overlapped each other as compared with the conventional detector panel, in the manufacturing step, as shown in FIG. 5, the gate bus lines 6 in a vertical direction are formed on a glass base plate 13. Then, connecting points (point A, point B, point C and so on), where the gate bus lines in the vertical direction are connected to the gate bus lines 6 in a horizontal direction to be formed subsequently, are formed in pad forms to improve the connection. Thereafter, insulating films, such as $SiN_x$, are formed at the portions where the gate bus lines 6 are overlapped each other. Then, the gate bus lines 6 in the horizontal direction are formed while being connected. Steps after this step are the same as in the conventional detector panel.

Figure 2:
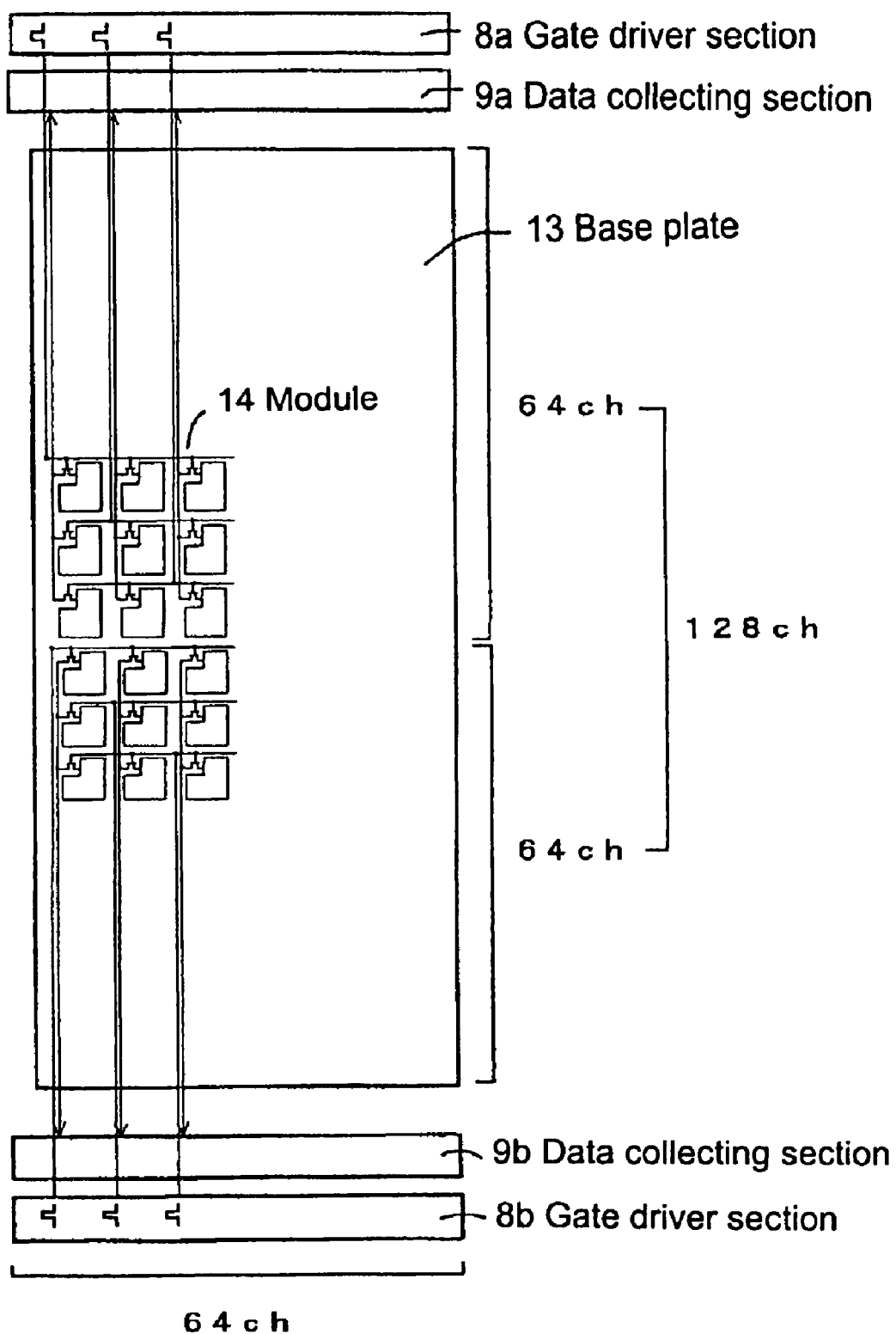
FIG. 2 is an explanatory view showing one module of the two-dimensional array type radiation detector of the invention.

Next, an embodiment of a large-sized two-dimensional array type radiation detector for a cone beam X-ray CT apparatus will be explained with reference to FIG. 2. The detector panel is manufactured as one module 14 in which pixels 12 are formed in a matrix structure as shown in FIG. 1. In the module 14, 64 ch×128 ch are formed on the single base plate 13. 128 ch in a vertical direction are divided in half so that 64 ch are formed on an upper half and 64 ch are formed on a lower half. The gate bus lines 6 and the data bus lines 7 are arranged side by side in parallel vertically. The gate driver section 8a for the horizontal scanning and the data collecting section 9a are disposed at an upper side, and the gate driver section 8b for the horizontal scanning and the data collecting section 9b are disposed at a lower side. The matrix size thereof is 128 ch×64 ch, and if each pixel is assumed to be a square of 1.5 mm, a dimension of the module is 192 mm×96 mm.

Figure 3A:
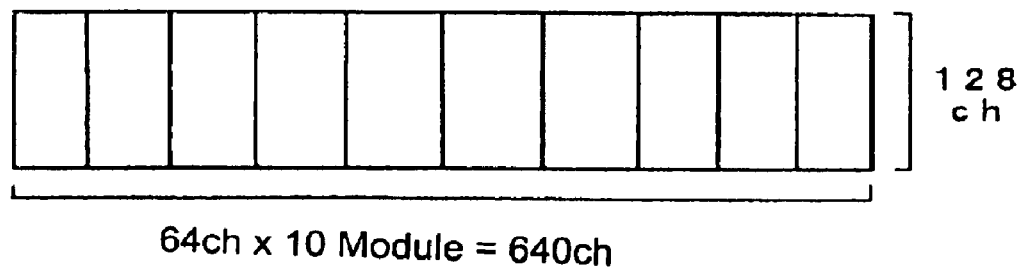
FIGS. 3(a) and 3(b) are explanatory views showing an embodiment of the detector used for a cone beam X-ray CT apparatus by combining modules of the two-dimensional array type radiation detector of the invention.
Figure 3B:
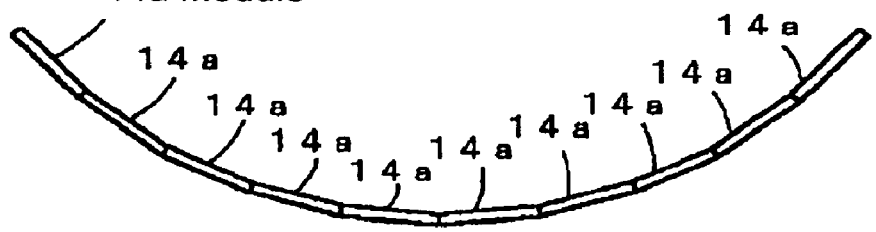
Figure 4:
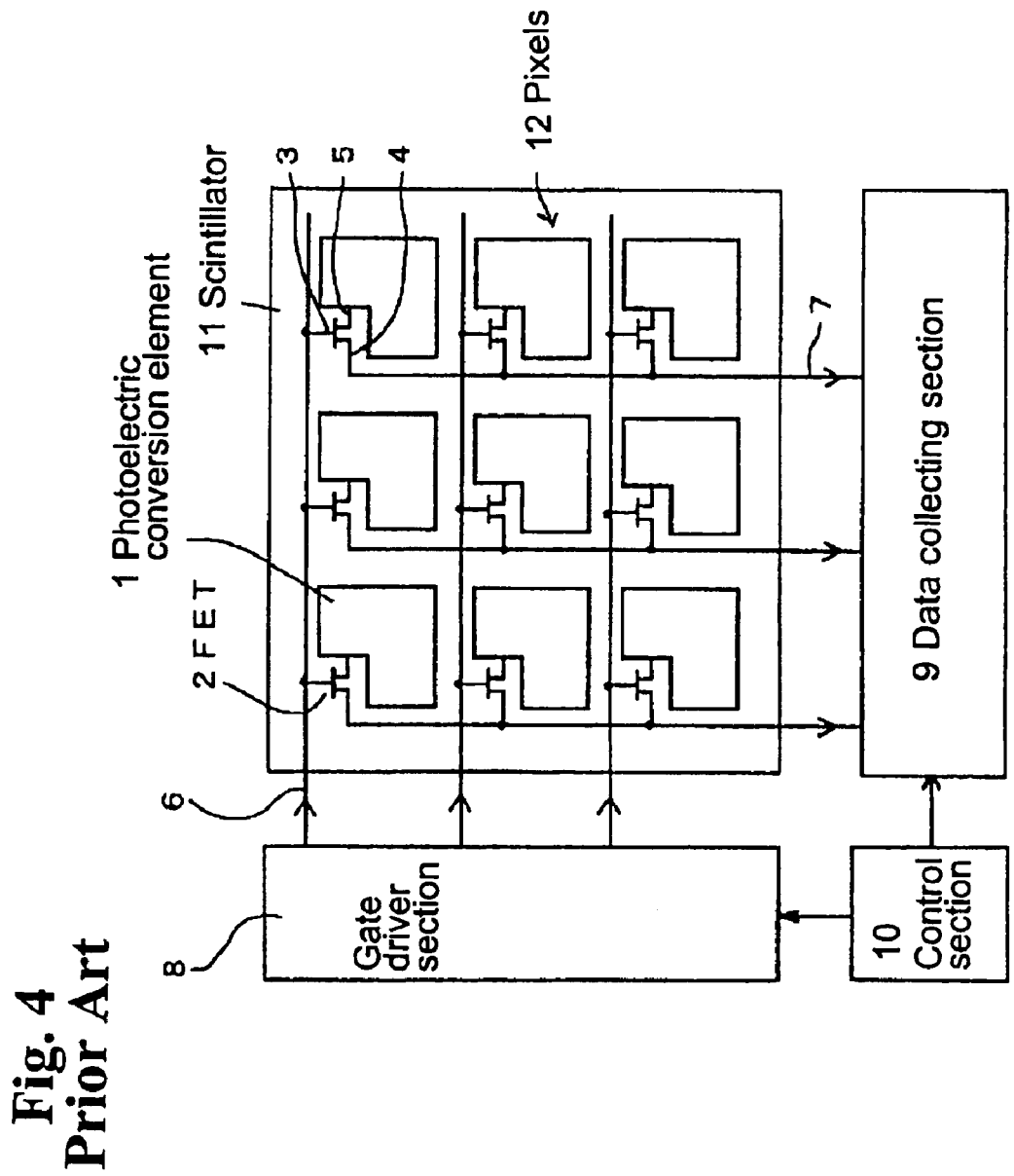
FIG. 4 is a diagram showing a conventional two-dimensional array type radiation detector.

When ten modules are connected as shown in FIG. 3, they constitute a two-dimensional array type radiation detector for a cone beam X-ray CT apparatus, which has the matrix size of 640 ch×128 ch, and a module dimension of 960 mm×192 mm. In this structure of connecting the modules in a row, it is possible to arrange the module surface to face the focusing direction of the X-ray tube.

In the two-dimensional array type radiation detector of the invention structured as described above, one gate bus line and one data bus line are arranged parallel to each other at each insensitive section located between the respective pixel rows, and the gate driver section for the scanning circuit and the data collecting section for reading the signals occupy only one side of the detector panel. Therefore, a plurality of detector panels manufactured per module can be connected without having a dead space, so that the large two-dimensional array type radiation detector can be manufactured. Also, since the detector is manufactured per module, yield is excellent in manufacturing, and even if the detector breaks down, it can be repaired by replacing the broken module only.

While the invention has been explained with reference to the specific embodiments of the invention, the explanation is illustrative and the invention is limited only by the appended claims.

What is claimed is:

1. A two-dimensional array type radiation detector, comprising:

converting layers for responding to radiation and outputting a charge signal corresponding to an incident amount to thereby form pixels, switching elements arranged in a matrix form under the converting layers and connected to the converting layers, gate bus lines and data bus lines connected to the switching elements and arranged parallel to each other in spaces of rows of the pixels, a gate driver section connected to the respective switching elements through the gate bus lines for sequentially turning on the respective switching elements at a time of reading signals, a data collecting section connected to the pixels through the data bus lines for reading out charge signals stored in the respective pixels, and a control section connected to the gate driver section and the data collecting section to control the same, wherein the two-dimensional array type radiation detector constitutes one module, and a plurality of the modules is connected at end surfaces where the gate bus lines and data bus lines are not formed.

2. A two-dimensional array type radiation detector, comprising:

converting layers for responding to radiation and outputting a charge signal corresponding to an incident amount to thereby form pixels, switching elements arranged in a matrix form under the converting layers and connected to the converting layers, gate bus lines and data bus lines connected to the switching elements and arranged parallel to each other in spaces of rows of the pixels, a gate driver section connected to the respective switching elements through the gate bus lines for sequentially turning on the respective switching elements at a time of reading signals, a data collecting section connected to the pixels through the data bus lines for reading out charge signals stored in the respective pixels, and a control section connected to the gate driver section and the data collecting section to control the same, wherein one of said gate bus lines and one of said data bus lines are disposed in a space between two rows of the pixels, and said gate bus lines include line sections extending perpendicular to the data bus lines, one line section being connected to one gate bus line.

3. A two-dimensional array type radiation detector as claimed in claim 2, wherein said data collecting section, gate driver section and control section are all located at one side of the converting layers.

* * * * *